(12) United States Patent
Takayoshi et al.

(10) Patent No.: US 7,371,971 B2
(45) Date of Patent: May 13, 2008

(54) WIRED CIRCUIT BOARD AND PRODUCING METHOD THEREOF

(75) Inventors: Yuichi Takayoshi, Osaka (JP); Kazushi Ichikawa, Osaka (JP); Toshiki Naito, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/349,188

(22) Filed: Feb. 8, 2006

(65) Prior Publication Data

US 2006/0176069 A1    Aug. 10, 2006

(30) Foreign Application Priority Data

Feb. 9, 2005    (JP)    ............................. 2005-033327

(51) Int. Cl.
*H05K 1/03*    (2006.01)

(52) U.S. Cl. ....................... 174/255; 174/254; 174/261

(58) Field of Classification Search ................ 174/255, 174/254, 260, 261
See application file for complete search history.

(56) References Cited

U.S. PATENT DOCUMENTS

| | | | | |
|---|---|---|---|---|
| 4,280,132 | A * | 7/1981 | Hayakawa et al. | 257/667 |
| 6,668,449 | B2 * | 12/2003 | Rumsey et al. | 29/840 |
| 6,710,458 | B2 * | 3/2004 | Seko | 257/778 |
| 6,858,921 | B2 * | 2/2005 | Kashiwagi et al. | 257/668 |

| | | | |
|---|---|---|---|
| 2005/0001299 | A1 | 1/2005 | Ryu et al. |

FOREIGN PATENT DOCUMENTS

| | | |
|---|---|---|
| DE | 103 42 298 A1 | 9/2003 |
| EP | 0 715 201 A2 | 6/1996 |
| EP | 0 715 201 A3 | 6/1996 |
| JP | H04-188800 | 7/1992 |
| JP | H05-029719 | 2/1993 |
| JP | H10-209612 | 8/1998 |
| JP | 2003-309148 | 10/2003 |

* cited by examiner

*Primary Examiner*—Ishwar I. B. Patel
(74) *Attorney, Agent, or Firm*—Jean C. Edwards, Esq.; Akerman Senterfitt (57) ABSTRACT

A wired circuit board that can provide improved reliability on connection between the terminal portions and the external terminals while ensuring high productivity and cost reduction, and a production method thereof. After a conductive pattern 3 including terminal portions 6 to connect with external terminals 22 of an electronic component 21 and criterion marks 8 to determine presence or absence of an inhibitory portion 23 that may be formed due to formation of an insulating cover layer 4 to inhibit connection between the terminal portions 6 and the external terminals 22 are formed on the insulating base layer 2 simultaneously, the insulating cover layer 4 to cover the conductive pattern 3 and an opening 7 from which the terminal portions 6 and the criterion marks 8 are exposed is formed. Thereafter, the presence or absence of the inhibitory portion 23 is determined with reference to the criterion marks 8 exposed from the opening 7 of the insulating cover layer 4.

4 Claims, 9 Drawing Sheets

WIRED CIRCUIT BOARD AND PRODUCING METHOD THEREOF

CROSS REFERENCE TO RELATED APPLICATION

This application claims priority from Japanese Patent Application No. 2005-33327, filed on Feb. 9, 2005, the contents of which are herein incorporated by reference in their entirety.

BACKGROUND OF THE INVENTION

1. Field of the Invention

The present invention relates to a wired circuit board and to a producing method thereof. More particularly, the present invention relates to a wired circuit board having a terminal portion to be connected with external terminals and to a producing method thereof.

2. Description of the Prior Art

The wired circuit board usually has a conductive pattern configured by a plurality of lines of wire formed on an insulating base layer and further has an insulating cover layer formed on the insulating base layer to cover the conductive pattern.

This wired circuit board has a terminal portion formed in the conductive pattern to be connected with external terminals of an electronic component and the like. The insulating cover layer is formed to have an opening formed to correspond to the terminal portion so that the terminal portion can be exposed from the opening to connect with the external terminals.

Accordingly, positional precision of the relative position of the terminal portion with the opening and dimensional precision of the opening are critical for connecting the terminal portion with the external terminals with high precision.

There are three known methods for forming the insulating cover layer to have the opening in it, as outlined below. The first method is a method using a screen printing method in which a solder resist is formed to form the opening in the insulating cover layer. The second method is a method in which an insulating resin film with a preformed opening is adhesively bonded to form the opening in the insulating cover layer, or a method in which an insulating resin film is adhesively bonded, first, and, then, the opening is formed in the insulating resin film. The third method is a method using photolithography in which after coated, photosensitive resin is exposed to light and developed to form the opening in the insulating cover layer.

Figure 14:
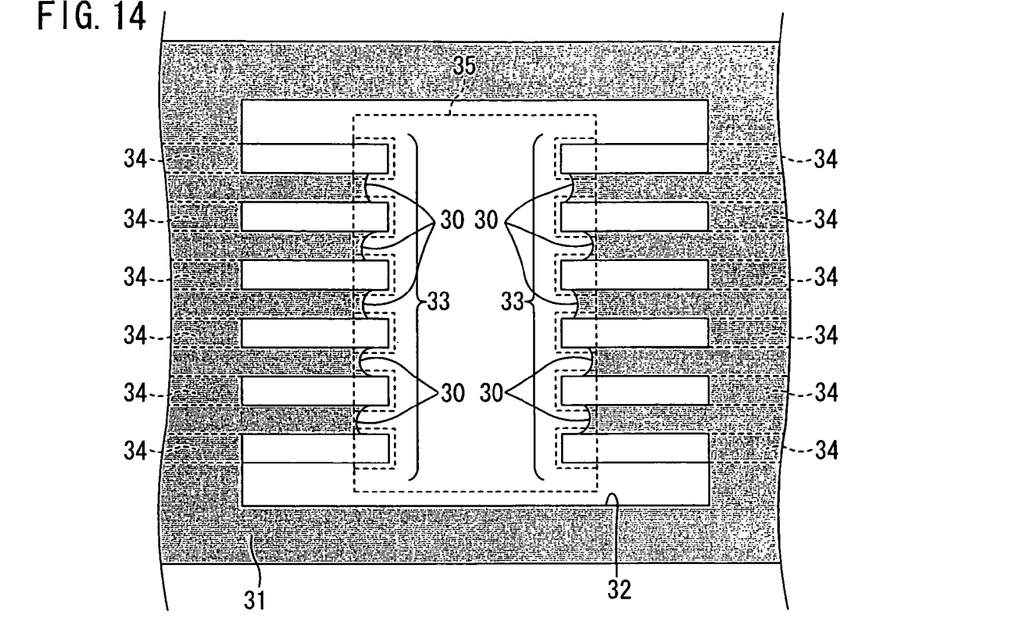
FIG. 14 is an explanatory view of a principal part of a conventional conductive pattern corresponding to FIG. 3 (an aspect of the insulating cover layer formed by the solder resist)

However, the first method has the problem that when printed (coated), solder resist 30 may flow into between lines of wire 34 at the terminal portions 33 exposed from the opening 32 of the insulating cover layer 31 due to the capillary phenomenon until it reaches an electronic component mounting place 35 where the terminal portion 33 is connected with the external terminals, as shown in FIG. 14. In this case, it becomes difficult to mount the electronic component to connect the external terminals with the terminal portion 33.

The second method has the problem that an adhesive may flow into between the lines of wire 34 due to the capillary phenomenon until it reaches the electronic component mounting place 35 where the terminal portion 33 is connected with the external terminals, as is the case with the first method. In this case also, it becomes difficult to mount the electronic component to connect the external terminals with the terminal portion 33.

Figure 15:
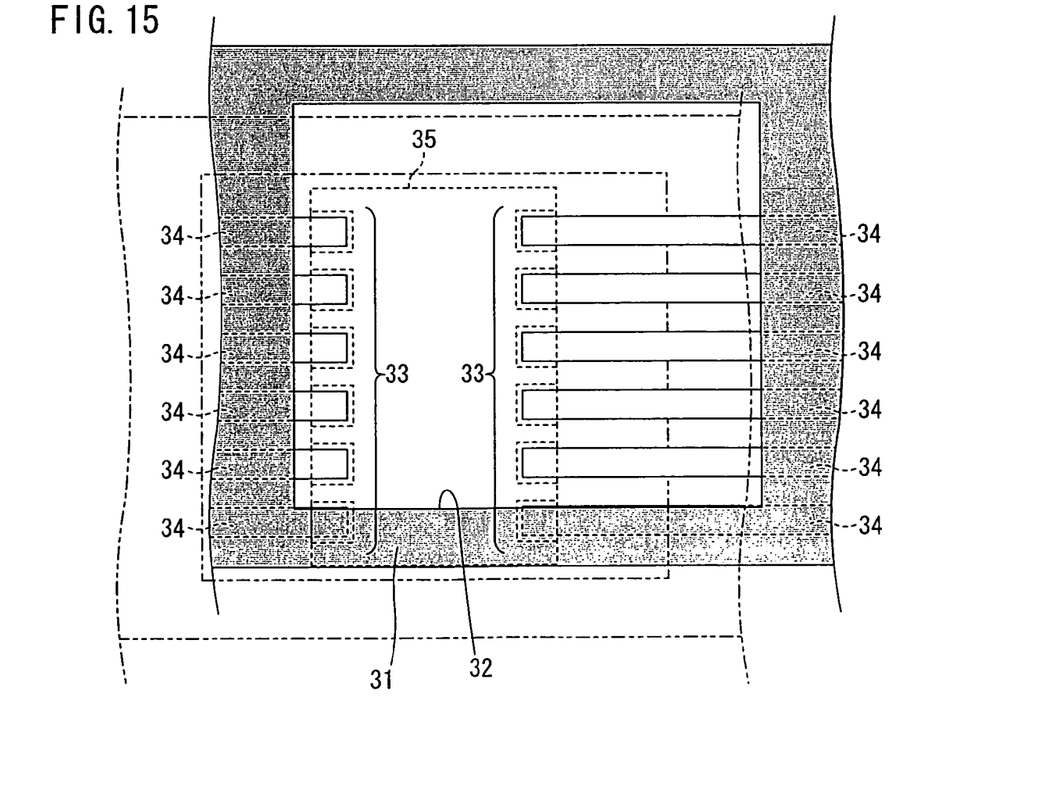
FIG. 15 is an explanatory view of a principal part of a conventional conductive pattern corresponding to FIG. 3 (an aspect of the insulating cover layer formed by the photolithography using a photosensitive resin).

The third method has the problem that when a photo mask is out of position in the process of the photolithography, the electronic component mounting position 35 may be covered with the insulating cover layer 31, as shown in FIG. 15. In this case also, it becomes difficult to mount the electronic component to connect the external terminals with the terminal portion 33.

The prior art proposes solution that the lines of wire at the terminal portion are machined using a bending or pressing process to provide e.g. an indented surface to make it hard for the solder resist to flow out, so as to prevent the solder resist printed from flowing out to a device hole side (Cf. JP Laid-open (Unexamined) Patent Publication No. 2003-309 148, for example).

However, the provision of the indented surface for the line of wire by the machining process requires a cumbersome and complicated work, causing reduction in workability and increase in cost.

Also, it is usual that whether or not the insulating cover layer reaches the electronic component mounting place is determined by a continuity test after the mounting of the electronic component or by measurement of a dimension of the insulating cover layer flown in between the lines of wire at the terminal portions. However, such an inspection carried out during the production process makes it hard to provide cost reduction while ensuring high productivity.

SUMMARY OF THE INVENTION

It is an object of the present invention to provide a wired circuit board that can provide improved reliability on connection between the terminal portions and the external terminals while ensuring high productivity and cost reduction, and a production method thereof.

The present invention provides a novel wired circuit board comprising an insulating base layer, a conductive pattern formed on the insulating base layer, and an insulating cover layer formed on the insulating base layer to cover the conductive pattern, wherein the conductive pattern includes terminal portions to connect with external terminals, wherein an opening is formed in the insulating cover layer to correspond to the terminal portions, and wherein criterion marks are provided at the locations adjacent to the terminal portions on the insulating base layer exposed from the opening, to determine presence or absence of an inhibitory portion that may be formed due to formation of the insulating cover layer to inhibit connection between the terminal portions and the external terminals.

Also, the present invention provides a novel production method of a wired circuit board comprising the process of forming a conductive pattern including terminal portions to connect with external terminals on an insulating base layer, the process of forming an insulating cover layer on the insulating base layer to cover the conductive pattern and form an opening from which the terminal portions are exposed, and the process of determining presence or absence of an inhibitory portion that may be formed due to formation of the insulating cover layer to inhibit connection between the terminal portions and the external terminals, wherein in the process of forming the conductive pattern, criterion marks to determine presence or absence of the insulating cover layer that may inhibit connection between the terminal portions and the external terminals are formed on the insulating base layer exposed from the opening at the same time as the conductive pattern is formed, and wherein in the process of determining the presence or absence of the inhibitory portion that may be formed due to the formation of the insulating cover layer to inhibit the connection between the terminal portions and the external terminals, the presence or absence of the inhibitory portion is determined with reference to the criterion marks.

In the wired circuit board of the present invention, the criterion marks to determine the presence or absence of the inhibitory portion that may be formed due to the formation of the insulating cover layer to inhibit the connection between the terminal portions and the external terminals are formed at locations adjacent to the terminal portions on the insulating base layer exposed from the opening. This can facilitate determination on whether the inhibitory portion is present or absent, using the criterion marks as the basis for the determination. This can provide a wired circuit board that can provide improved reliability on connection between the terminal portions and the external terminals while ensuring high productivity and cost reduction.

In the production method of wired circuit board of the present invention, the criterion marks and the conductive pattern are formed simultaneously for determining the presence or absence of the inhibitory portion that may be formed due to the formation of the insulating cover layer to inhibit the connection between the terminal portions and the external terminals, using the criterion marks as the basis for the determination. This method can allow effective formation of the criterion marks and can facilitate determination on whether the inhibitory portion is present or absent, using the criterion marks as the basis for the determination. This can provide the result of providing improved reliability on the connection between the terminal portions and the external terminals while ensuring high productivity and cost reduction.

BRIEF DESCRIPTION OF THE DRAWINGS

In the drawings:

FIG. 1 (*a*) is a sectional view of a principal part of a wired circuit board of an embodiment of the present invention, and FIG. 1(*b*) is a plan view of a principal part of the wired circuit board shown in FIG. 1(*a*)

DETAILED DESCRIPTION OF THE PREFERRED EMBODIMENT

Figure 1:
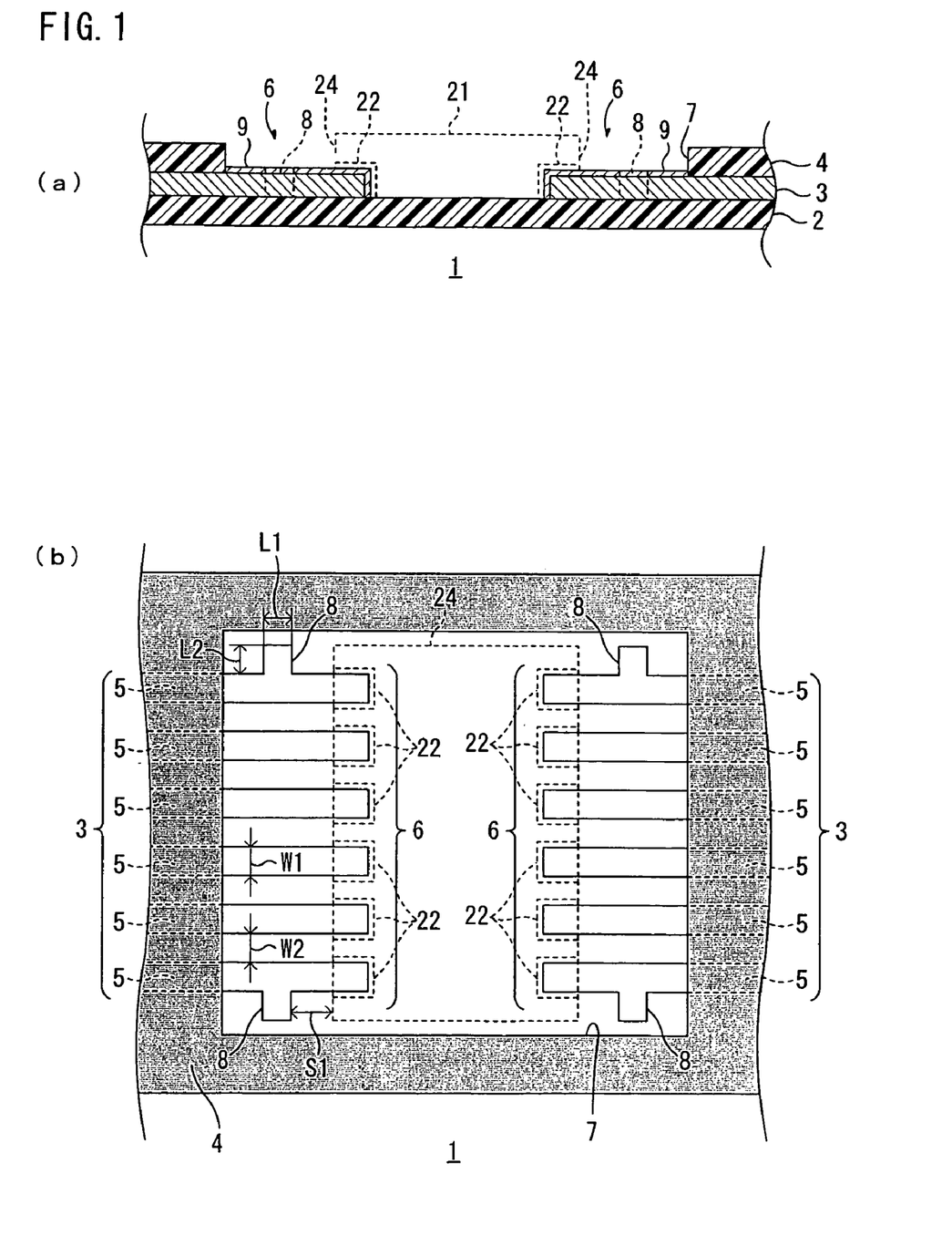

FIG. 1 (*a*) is a sectional view of a principal part of a wired circuit board of an embodiment of the present invention, and FIG. 1(*b*) is a plan view of a principal part of the wired circuit board shown in FIG. 1(*a*).

In FIG. 1, the wired circuit board 1 is a flexible wired circuit board extending like a generally square strip as viewed from top, comprising an insulating base layer 2, a conductive pattern 3 formed on the insulating base layer 2, and an insulating cover layer 4 formed on the insulating base layer 2 to cover the conductive pattern 3, as shown in FIG. 1(*a*).

The insulating base layer 2 is formed in a generally rectangular strip form as viewed from top, as shown in FIG. 1(*b*).

The conductive pattern 3 is configured by a plurality of lines of wire 5 extending along a lengthwise direction of the wired circuit board 1 and arranged in parallel with each other at spaced intervals in a widthwise direction of the wired circuit board 1 (a direction orthogonal to the lengthwise direction of the wired circuit board 1), including terminal portions 6 to connect with external terminals 22 of an electronic component 21. The terminal portions 6 are formed so that the lines of wire 5 are divided at spaced intervals in the lengthwise direction of the wired circuit board 1. A width W1 of each line of wire 5 is set to be in the range of 5-500 µm, and an interval W2 between adjacent lines of wire 5 is set to be in the range of 5-500 µm. When the interval W2 between the lines of wire 5 is not more than 5 µm, it comes to be likely that an inhibitory portion 23 mentioned later (Cf FIG. 3) is formed between those lines of wire.

An opening 7, opened in a generally rectangular form as viewed from top, is formed in the insulating cover layer 4 to confront the terminal portions 6 with respect to a laminating direction of the respective layers being laminated and also surround the terminal portions 6.

In this wired circuit board 1, criterion marks 8 are provided on the insulating base layer 2 exposed from the opening 7 of the insulating cover layer 4 at the locations adjacent to the terminal portions 6.

Figure 3:
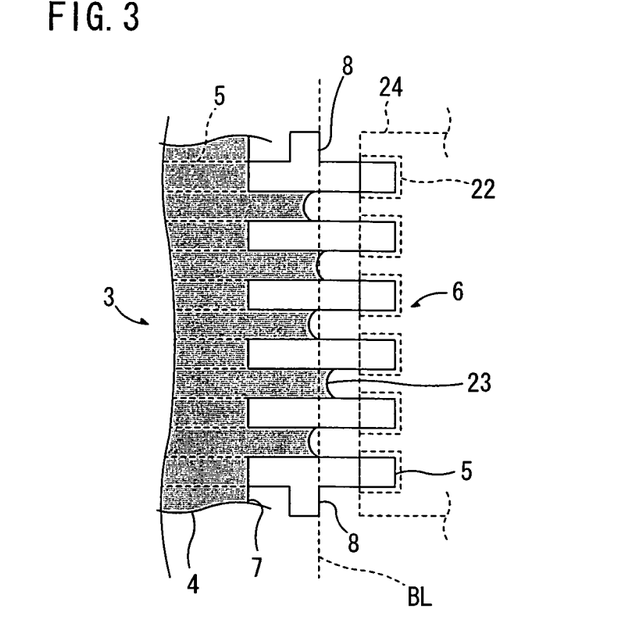
FIG. 3 is an explanatory view of the principal part, illustrating the state that solder resist flows into between the lines of wire at the terminal portions to form an inhibitory portion, which is determined with reference to the criterion marks.

The criterion marks 8 are formed to determine the presence or absence of an inhibitory portion 23 that may be formed due to formation of the insulating cover layer 4, as mentioned later, to inhibit the connection between the terminal portions 6 and the external terminals 22 of the electronic component 21 (Cf. FIG. 3).

The criterion marks 8 are provided on the lines of wire 5 at both ends thereof in the widthwise direction, one on each side of four opposing lines of wire 5 at the terminal portions 6 divided in the lengthwise direction of the wired circuit board 1 (four in total).

The criterion marks 8 are in the form of a square, as viewed from top, and are arranged to contact with the lines of wire 5 located at widthwise outermost sides of the terminal portions 6 from widthwise outside.

A lengthwise dimension L1 of each criterion mark 8 is set to be in the range of 15-150 µm, or preferably 30-80 µm, and a widthwise dimension of the same is set to be in the range of 15-150 µm, or preferably 30-80 µm. If the criterion marks 8 have larger dimensions, then available spaces for the criterion marks 8 to be provided will be limited. On the other hand, if the criterion marks 8 have smaller dimensions, then it may become difficult to observe the criterion marks 8.

Also, the criterion marks 8 are located between a mounting position 24 for the external terminals 22 of the electronic component 21 to be connected with the terminal portions 6 and ends of the opening 7 with respect to the lengthwise direction of the lines of wire 5 in the terminal portions 6. To be more specific, solder resist or adhesive mentioned later may flow into between the lines of wire 5 inwardly to the opening 7 along the lengthwise direction of the lines of wire 5. When the solder resist or adhesive comes closer to the mounting position 24, the electronic component 21 cannot be properly mounted by the inhibitory portion 23 formed by the solder resist or adhesive (Cf. FIG. 3). Accordingly, the criterion marks 8 are located in close proximity to the positions where the connection between the external terminals 22 and the terminal portions 6 may be inhibited by the inhibitory portion 23. The locations for the criterion marks 8 to be situated are properly determined depending on the types of the electronic components 21. For example, the criterion marks 8 are spaced e.g. at least 2001 µm, or preferably 220-3001 µm, apart from the mounting position 24 in the lengthwise direction of the lines of wire 5 which is the spaced interval S1 between the mounting position 24 and the criterion marks 8.

The lines of wire 5 at the terminal portions 6 exposed from the opening 7 of the insulating cover layer 4 are covered with a metal plating layer 9 (shown in FIG. 1(a) only) to ensure the reliability on the connection with the external terminals 22 of the electronic component 21.

Next, a production method of this wired circuit board 1 will be described with reference to FIG. 2.

Figure 2:
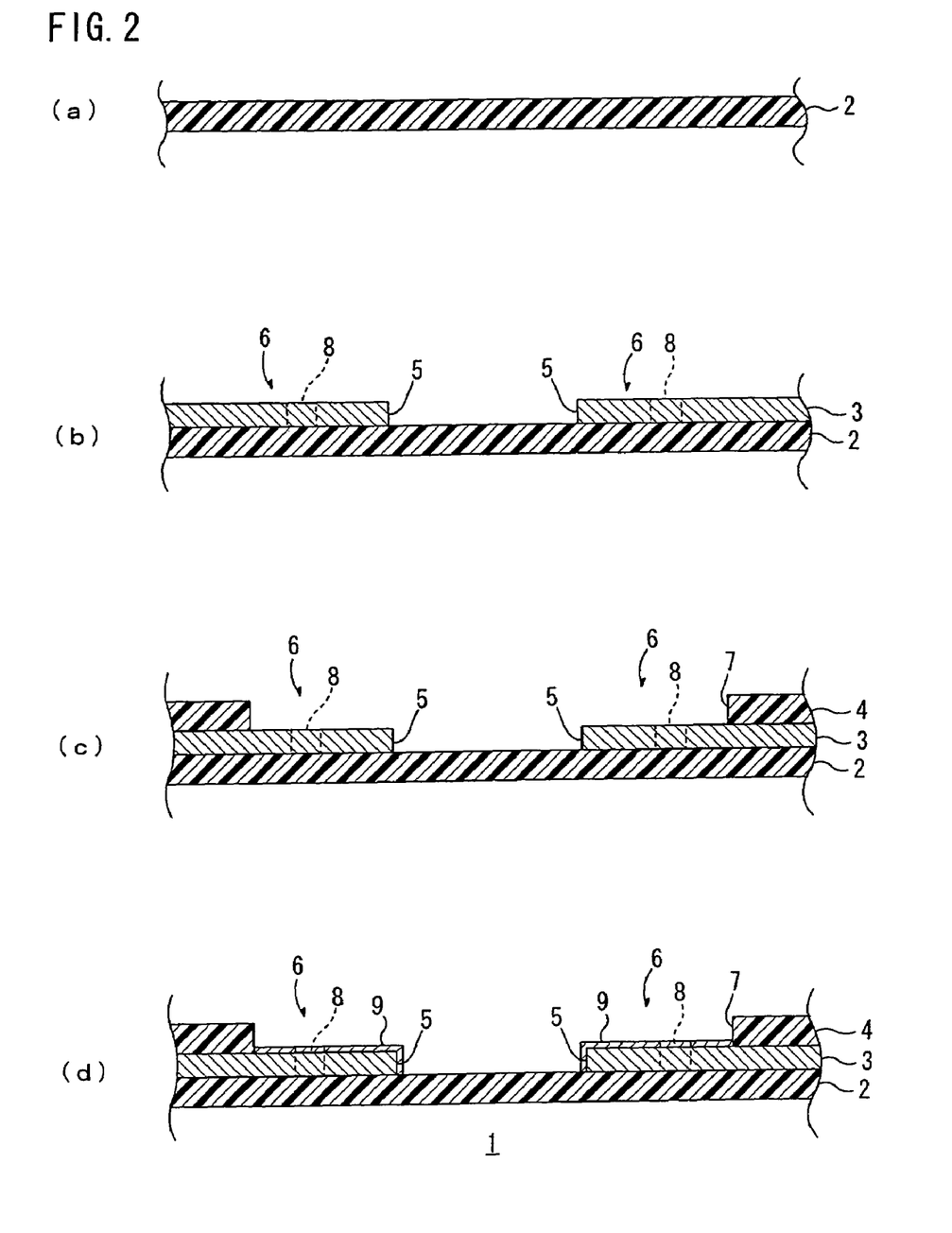
FIG. 2 is a production process drawing showing a production method of the wired circuit board shown in FIG. 1, (a) showing the process of preparing an insulating base layer, (b) showing the process of forming a conductive pattern and a criterion mark simultaneously on the insulating base layer, (c) showing the process of forming an insulating cover layer on the insulating base layer to form an opening from which a terminal portion is exposed, and (d) showing the process of forming a metal plating layer on the lines of wire at the terminal portion exposed from the opening of the insulating cover layer.

In this method, the insulating base layer 2 is prepared, first, as shown in FIG. 2(a).

The materials that may be used for the insulating base layer 2 include, for example, synthetic resins in film form, such as polyimide resin, polyamide imide resin, acrylic resin, polyether nitrile resin, polyether sulfonic resin, polyethylene terephthalate resin, polyethylene naphthalate resin and polyvinyl chloride resin. Polyimide resin is preferably used for the insulating base layer 2.

The insulating base layer 2 is prepared using a synthetic resin film. It may be prepared by the method that after a varnish of synthetic resin coated is formed on a stripping sheet, not shown, by a casting method, and dried, and cured, if necessary, or by the method that after the varnish of photosensitive synthetic resin coated is formed on the stripping sheet, it is dried, exposed to light, and developed, to form the coating of a predetermined pattern, and cure it, if necessary. The insulating base layer 2 thus formed has thickness of e.g. 5-50 µm.

Then, the conductive pattern 3 and criterion marks 8 are simultaneously formed on the insulating base layer 2, as shown in FIG. 2(b). For example, copper, nickel, gold, solder, or alloys thereof may be used for the conductive pattern 3 and the criterion marks 8. Copper is preferably used for them in terms of electrical conductivity, cost efficiency, and easiness in workability.

The conductive pattern 3 and the criterion marks 8 can be simultaneously formed on the insulating base layer 2 by a known patterning process, such as a subtractive process and an additive process. In these processes, the conductive pattern 3 is formed in the form of a predetermined pattern configured by a plurality of lines of wire 5 including the terminal portions 6 described above, and the criterion marks 8 are formed to be continuous with the lines of wire 5 located at widthwise outermost sides of the terminal portions 6.

Specifically, in the subtractive process, a metal foil is laminated on the entire surface of the insulating base layer 2 via, if necessary, an adhesive layer, first. Then, etching resist having a corresponding pattern to the conductive pattern 3 and the criterion marks 8 is formed on a surface of the metal foil. The etching resist is formed by a known process using photosensitive dry film resist and the like. Thereafter, after the metal foil exposed from the etching resist is removed by etching, the etching resist is removed by etching or stripping. Alternatively, the conductive pattern 3 and the criterion marks 8 may be simultaneously formed on the insulating base layer 2 by the method that a two-layer base material comprising the metal foil laminated on the insulating base layer 2 is prepared and, then, the metal foil is removed by etching.

In the additive process, a thin metal film (a seed film) is formed on the entire surface of the insulating base layer 2, first. The thin metal film is formed by a thin film formation process, such as a sputtering process, using chromium, nickel, copper, and alloys thereof. Then, a plating resist of a reverse pattern to the conductive pattern 3 and criterion marks 8 is formed on a surface of the thin metal film. The plating resist is formed by a known process using a photosensitive dry film resist, and the like to be exposed to light and developed. Thereafter, the conductive pattern 3 and the criterion marks 8 are simultaneously formed on the surface of the insulating base layer 2 exposed from the plating resist. The conductive pattern 3 and the criterion marks 8 are formed by the electrolytic plating, or preferably by the electrolytic copper plating, for example. Thereafter, the plating resist is removed by etching or stripping and then the thin metal film exposed from the conductive pattern 3 and the criterion marks 8 is removed by etching.

As a result, the criterion marks 8 and the conductive pattern 3 including the terminal portions 6 are formed simultaneously, as shown in FIG. 1(*b*). The conductive pattern 3 and the criterion marks 8 have thickness of e.g. 3-50 μm.

Then, the insulating cover layer 4 is formed on the insulating base layer 2, to form in the insulating cover layer 4 the opening 7 from which the terminal portions 6 are exposed, as shown in FIG. 2(*c*).

The insulating cover layer 4 is formed so that the opening 7 can be formed in the solder resist by a screen printing method. To be more specific, after known solder resist of epoxy type, acrylic type, urethane type, or the like type is coated over the insulating base layer 2 including the conductive pattern 3, the opening 7 is formed in the solder resist by the known screen printing method and then the solder resist is cured, thereby forming the insulating cover layer 4.

The insulating cover layer 4 may be formed in such a manner that a synthetic resin film (preferably, polyimide resin film) having the opening 7 previously formed by punching and the like is prepared and that film is adhesively bonded on to the insulating base layer 2 including the conductive pattern 3 via an adhesive or in such an alternative manner that after a synthetic resin film (preferably, polyimide resin film) is adhesively bonded on to the insulating base layer 2 including the conductive pattern 3 via the adhesive, the opening 7 is formed in that film by drilling, laser processing, etching, or the like. The adhesives that may be used include, for example, an epoxy type of adhesive and an acrylic adhesive. The adhesive layer formed by the adhesive has thickness of e.g. 5-30 μm.

Further, the insulating cover layer 4 may be formed to have the opening 7 formed by a known photolithography of exposing the photosensitive resin to light and developing it. To be more specific, after a varnish of synthetic resin coated is formed on the insulating base layer 2 including the conductive pattern 3 by the casting method, and dried. Then, the resulting coating is patterned to form the opening 7 by being exposed to light through a photo mask, developed, and cured, thereby forming the insulating cover layer 4.

The insulating cover layer 4 thus formed has thickness of e.g. 3-30 μm.

Then, the metal plating layer 9 is formed on the lines of wire 5 at the terminal portions 6 exposed from the opening 7 of the insulating cover layer 4, as shown in FIG. 1(*d*). The metals that may be used for the metal plating layer 9 include, for example, gold and nickel. The metal plating layer 9 is formed, for example, by electroless plating or electrolytic plating. Preferably, a nickel plating layer and a gold plating layer are laminated sequentially. In the case where the metal plating layer 9 is the gold plating layer, the metal plating layer 9 has thickness of e.g. 0.1-1 μm. In the case where the metal plating layer 9 is the nickel plating layer, the metal plating layer 9 has thickness of e.g. 0.5-5 μm.

Since the criterion marks 8 are formed to be continuous with the conductive pattern 3, the metal plating layer 9, when formed by electrolytic plating, is formed not only on the conductive pattern 3 but also on the criterion marks 8 by feeding power from common plating lead. The metal plating layer 9 can prevent corrosion of the criterion marks 8.

In this method, the presence or absence of the inhibitory portion 23 is determined with reference to the criterion marks 8 exposed from the opening 7 of the insulating cover layer 4, as shown in FIG. 3.

For example when the insulating cover layer 4 is formed from the solder resist, the solder resist, when coated, may flow into between the lines of wire 5 at the terminal portions 6 due to the capillary phenomenon, going inwardly of the opening 7 in the lengthwise direction of the lines of wire 5. When the flowing solder resist goes beyond the criterion marks 8 or goes across a reference line BL indicated by a dotted line connecting between the criterion marks 8 opposing in the widthwise direction, a portion of the solder resist extending inwardly beyond the criterion marks 8 is determined as the inhibitory portion 23.

For example when the insulating cover layer 4 is formed from the synthetic resin film to be adhesively bonded, the adhesive may flow into between the lines of wire 5 at the terminal portions 6 due to the capillary phenomenon when the synthetic resin film is laminated, going inwardly of the opening 7 in the lengthwise direction of the lines of wire 5. When the flowing adhesive goes beyond the criterion marks 8 or goes across the reference line BL indicated by the dotted line connecting between the criterion marks 8 opposing in the widthwise direction, a portion of the adhesive extending inwardly beyond the criterion marks 8 is determined as the inhibitory portion 23.

For example when the insulating cover layer 4 is formed by the photolithography using photosensitive resin to be exposed to light and developed, the insulating cover layer 4 formed may be displaced toward the mounting position 24 with respect to the criterion marks 8 due to the out-of-position of the photo mask, not shown. A portion of the insulating cover layer 4 formed and displaced toward the mounting position 24 with respect to the criterion marks 8 is determined as the inhibitory portion 23.

The presence or absence of the inhibitory portion 23 is determined with reference to the criterion marks 8 by observation under an optical microscope (of e.g. 20-40 magnifications), for example.

When the inhibitory portion 23 is determined as "Present", the wired circuit board 1 having such an inhibitory portion 23 is dealt with as defective goods which is unfit for mount of the electronic component 21 so that the connection between the external terminals 22 and the terminal portions 6 may be inhibited.

On the other hand, when the inhibitory portion 23 is determined as "Absent", the wired circuit board 1 having such an inhibitory portion 23 is dealt with as confirming goods which is fit for use so that the good connection between the external terminals 22 and the terminal portions 6 can be ensured. In this case, the electronic component 21 can be mounted on the wired circuit board 1 to electrically connect the external terminals 22 of the electronic component 21 with the lines of wire 5 at the terminal portions 6, as shown in FIG. 1(*a*), for example.

In the production method of this wired circuit board 1, the criterion marks 8 are formed at the same time as the conductive pattern 3 and the presence or absence of the inhibitory portion 23 is determined with reference to the criterion marks 8. This can allow effective formation of the criterion marks 8 and can facilitate determination on whether the inhibitory portion 23 is present or absent, using the criterion marks 8 as the basis for the determination. This can provide the result of providing improved reliability on the connection between the lines of wire 5 at the terminal portions 6 and the external terminals 22 of the electronic component 21 while ensuring high productivity and cost reduction.

In the wired circuit board 1 thus produced, since the determination on whether the inhibitory portion 23 is present or absent can be facilitated, using the criterion marks 8 as the basis for the determination, there can be provided the wired circuit board 1 that can provide improved reliability on connection between the lines of wire 5 at the terminal portions 6 and the external terminals 22 of the electronic component 21 while ensuring high productivity and cost reduction.

While in the illustration above, the criterion marks 8 are formed in a square form, as viewed from top, to contact with the lines of wire 5 located at the widthwise outermost sides of the terminal portions 6, for example, additional lines of wire 10 used particularly for forming the criterion marks 8 may be formed at the both widthwise outer sides further away from the both widthwise outermost sides of the lines of wire 5 at the terminal portions 6 so that they can be provided, at free end portions thereof, with the criterion marks 8.

Figure 4:
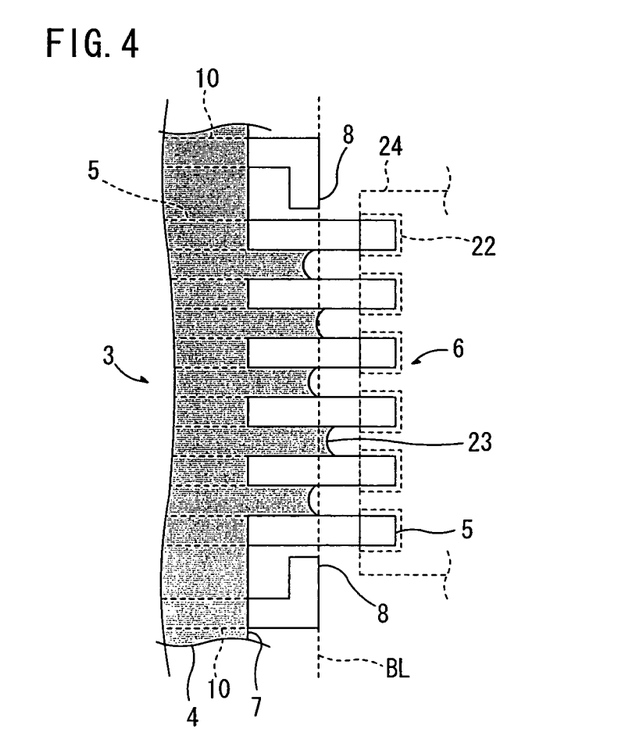
FIG. 4 is an explanatory view of the principal part corresponding to FIG. 3, showing another embodiment of the criterion marks (generally L-shaped criterion marks, as viewed from top, spaced apart from the lines of wire)

In FIG. 4, the additionally arranged lines of wire 10 extend along the lengthwise direction of the wired circuit board 1 and are arrayed in parallel at widthwise spaced intervals from the lines of wire 5 located at the widthwise outermost positions. The criterion marks 8 are formed in a generally L-shape to bend inwardly in the widthwise direction from the additionally arranged lines of wire 10 to the lines of wire 5 located at the widthwise outermost positions respectively, when viewed from top. A free end of each criterion mark 8 at its inner side in the widthwise direction is spaced apart from the related line of wire 5 at the widthwise outermost side in the widthwise direction.

Since the criterion marks 8 of the wired circuit board 1 shown in FIG. 4 are also formed to be continuous with the additionally arranged lines of wire 10, the metal plating layer 9, when formed by electrolytic plating, can be formed not only on the conductive pattern 3 but also on the criterion marks 8 by feeding power from common plating lead, to prevent corrosion of the criterion marks 8.

Figure 5:
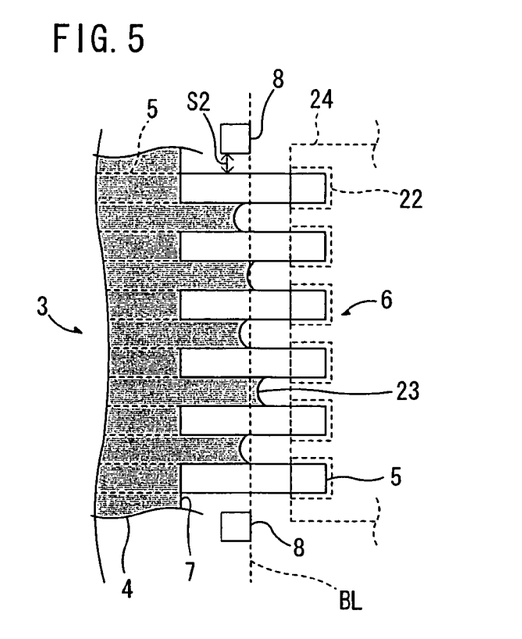
FIG. 5 is an explanatory view of the principal part corresponding to FIG. 3, showing another embodiment of the criterion marks (generally square criterion marks, as viewed from top, spaced apart from the lines of wire)

While in the illustration above, the criterion marks 8 are arranged to contact with the lines of wire 5 located at the widthwise outermost sides of the terminal portions 6, for example, the criterion marks 8 may be spaced apart from the lines of wire 5 located at both widthwise outermost sides of the terminal portions 6 at a spaced interval S2, as shown in FIG. 5. The space S2 at which the criterion marks 8 are widthwise spaced from the related lines of wire 5 is set to be within e.g. 70 μm, or preferably in the range of 15-30 μm.

Figure 6:
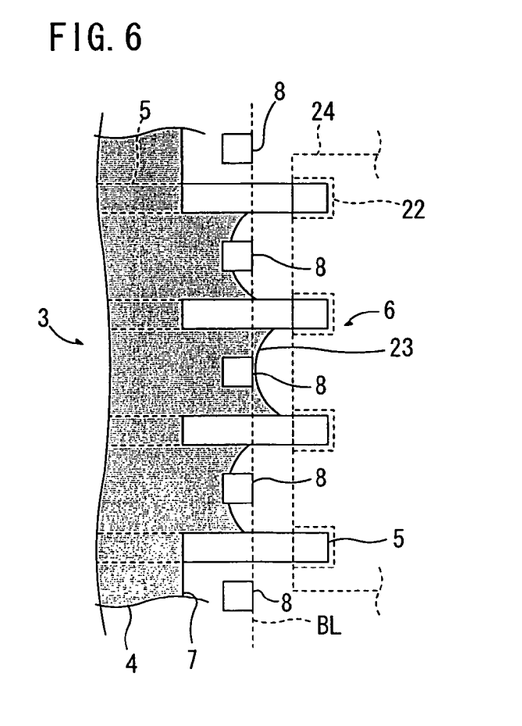
FIG. 6 is an explanatory view of the principal part corresponding to FIG. 3, showing another embodiment of the criterion marks (generally square criterion marks, as viewed from top, located between the lines of wire)

Further, the criterion marks 8 may be arranged between the adjacent lines of wire 5 along the widthwise direction, as shown in FIG. 6.

Figure 7:
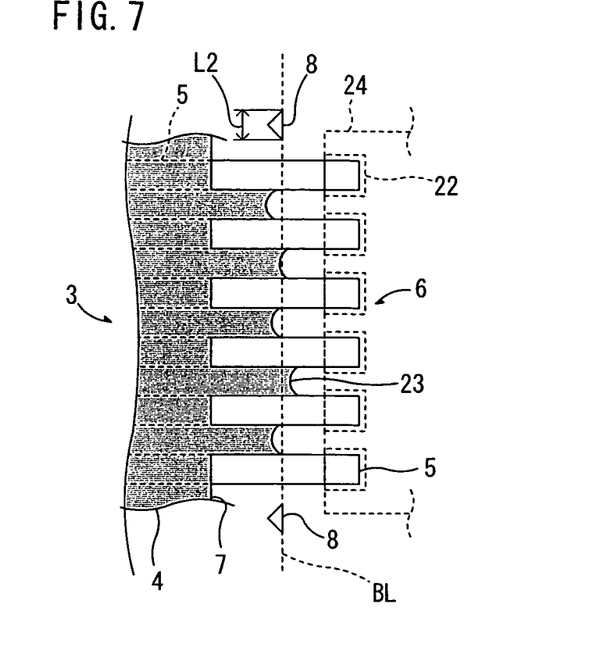
FIG. 7 is an explanatory view of the principal part corresponding to FIG. 3, showing another embodiment of the criterion marks (triangular criterion marks, as viewed from top, spaced apart from the lines of wire)
Figure 8:
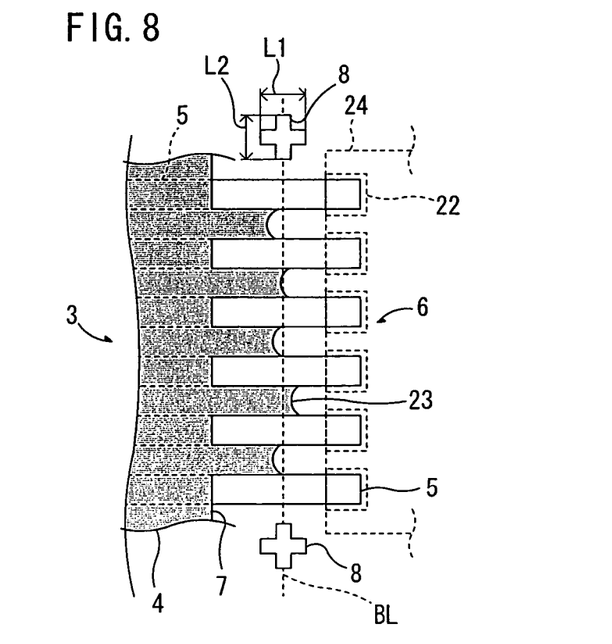
FIG. 8 is an explanatory view of the principal part corresponding to FIG. 3, showing another embodiment of the criterion marks (cruciform criterion marks, as viewed from top, spaced apart from the lines of wire)
Figure 9:
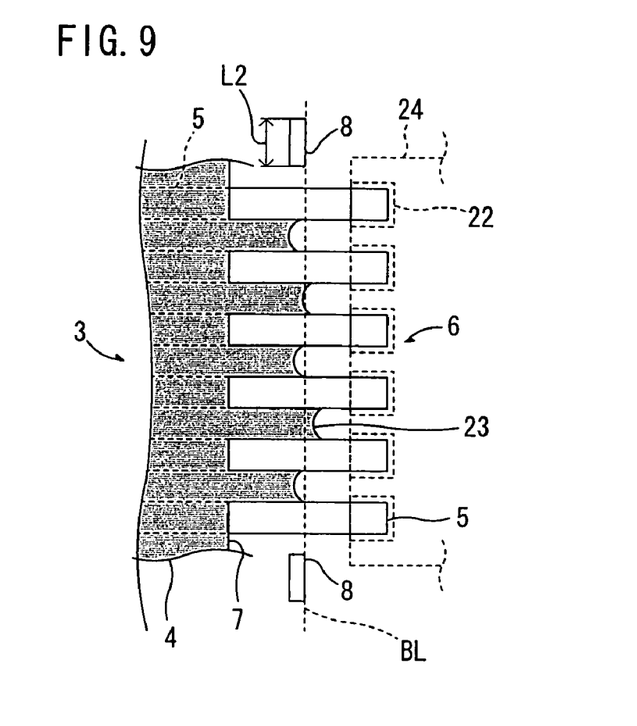
FIG. 9 is an explanatory view of the principal part corresponding to FIG. 3, showing another embodiment of the criterion marks (criterion marks of numeric character 1, as viewed from top, spaced apart from the lines of wire)
Figure 10:
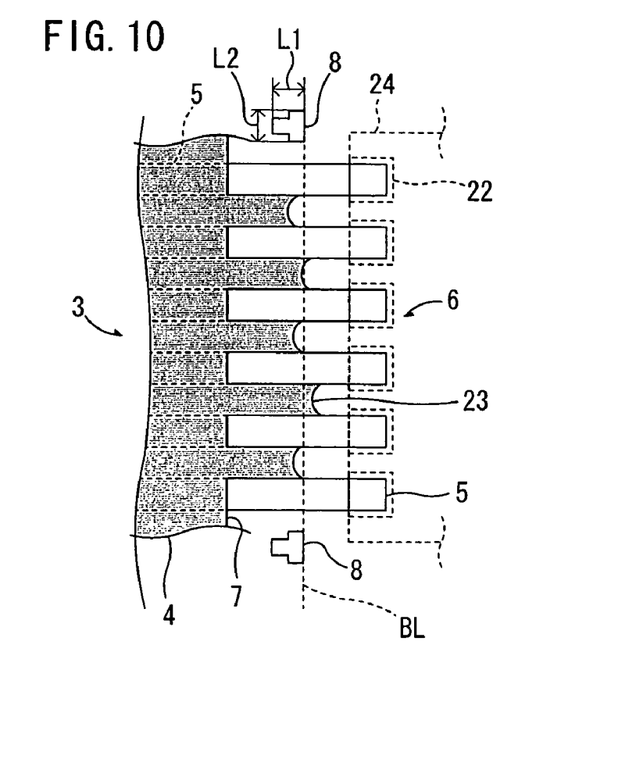
FIG. 10 is an explanatory view of the principal part corresponding to FIG. 3, showing another embodiment of the criterion marks (T-shaped criterion marks, as viewed from top, spaced apart from the lines of wire and extending along a lengthwise direction of the wired circuit board)
Figure 11:
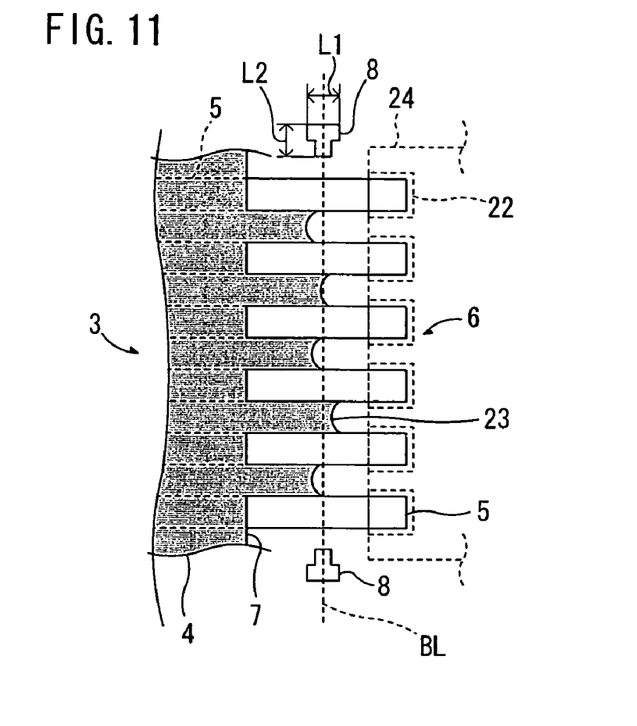
FIG. 11 is an explanatory view of the principal part corresponding to FIG. 3, showing another embodiment of the criterion marks (T-shaped criterion marks, as viewed from top, spaced apart from the lines of wire and extending along a widthwise direction of the wired circuit board)
Figure 12:
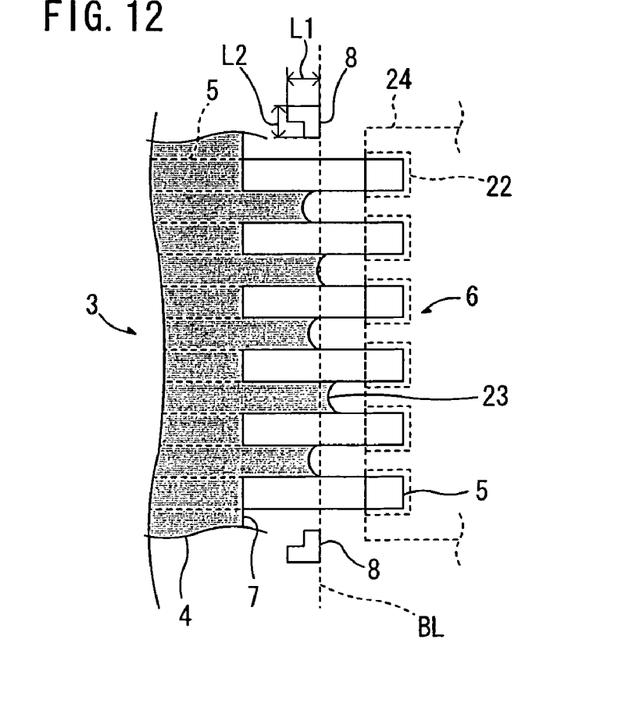
FIG. 12 is an explanatory view of the principal part corresponding to FIG. 3, showing another embodiment of the criterion marks (L-shaped criterion marks, as viewed from top, spaced apart from the lines of wire)
Figure 13:
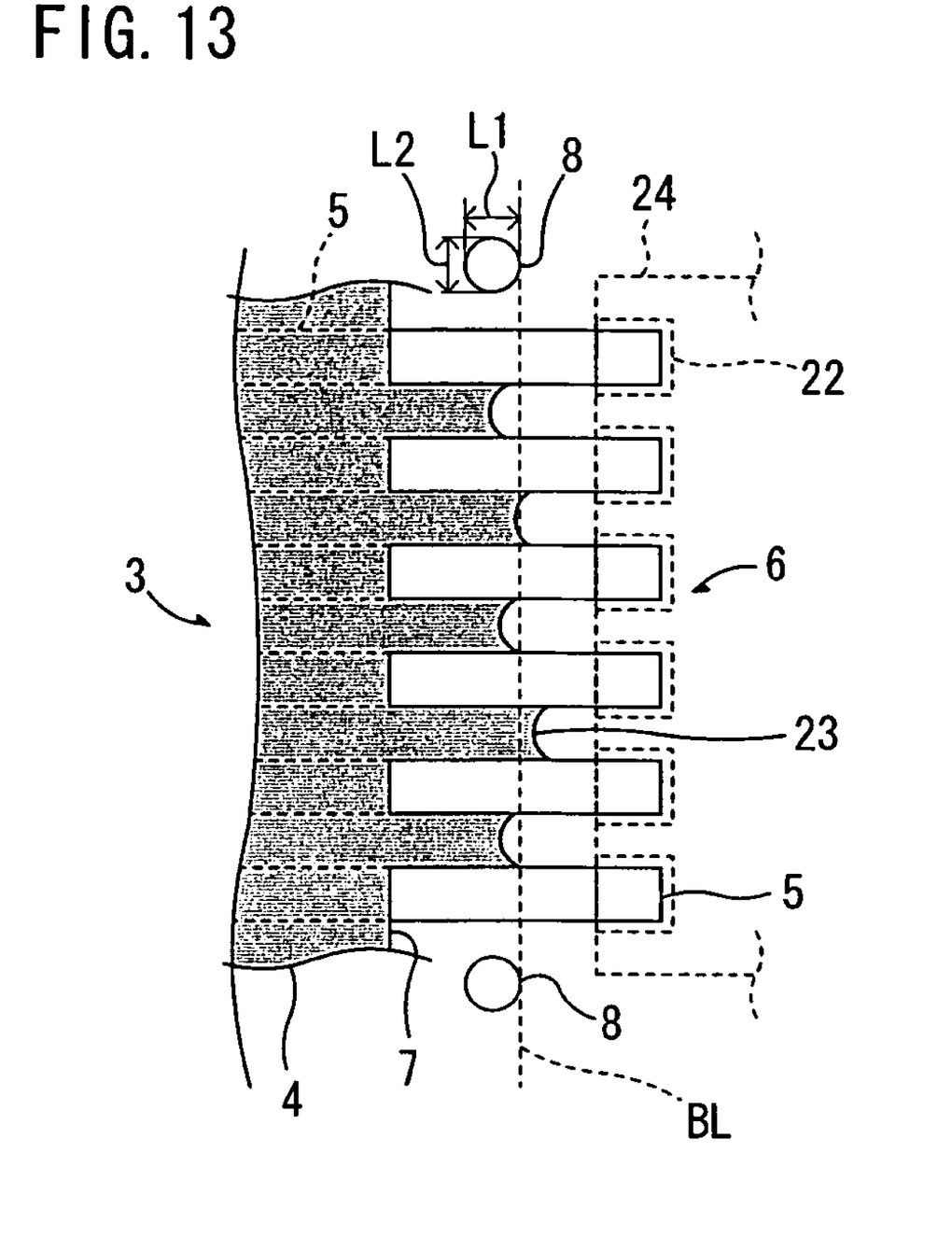
FIG. 13 is an explanatory view of the principal part corresponding to FIG. 3, showing another embodiment of the criterion marks (circular criterion marks, as viewed from top, spaced apart from the lines of wire)

As a substitute for the criterion marks 8 of square as viewed from top shown in FIG. 5, the criterion marks 8 may be formed in any geometrical or alphabetical shape, as viewed from top, such as, for example, a triangular shape (Cf. FIG. 7), a cruciform shape (Cf. FIG. 8), a numeric character 1 shape (FIG. 9), a T shape extending along the lengthwise direction of the wired circuit board 1 (Cf. FIG. 10), a T shape extending along the widthwise direction of the wired circuit board 1 (Cf. FIG. 11), an L shape (Cf FIG. 12), and a circular shape (Cf FIG. 13). The planar shape may be properly selected depending on intended purposes and applications.

Preferably, the criterion marks 8 have a planar shape including a linear portion through which the reference line BL indicated by the dotted line can be clearly identified between the opposing criterion marks 8 in the widthwise direction, like the respective criterion marks 8 shown in FIGS. 7-12.

The criterion marks 8 shown in FIGS. 7-12 have a lengthwise dimension L1 of 15-150 μm, or preferably 30-80 μm, and a widthwise dimension L2 of 15-150 μm, or preferably 30-80 μm.

Although in the embodiment illustrated above, the criterion marks 8 are formed from the same metal as that of the conductive pattern 3 at the same time that the conductive pattern 3 is formed, as long as the criterion marks 8 can serve as the criterion on the presence or absence of the inhibitory portion 23 for the microscopic observation or examination, no particularly limitation is imposed on the formation of the criterion marks 8. For example, the criterion marks 8 may be formed by forming cavities or through holes in the insulating base layer 2 exposed from the opening 7 of the insulating cover layer 4 by mold or laser processing.

EXAMPLE

While in the following, the present invention will be described in further detail with reference to Examples, the present invention is not limited thereto.

Example 1

Thousand wired circuit boards were produced in the following sequences.

An etching resist of 10 μm thick was formed on a copper clad laminate (two-layer base material) formed by laminating a copper foil of 18 μm thick on the insulating base layer of polyimide resin of 25 μm thick in the form of a pattern corresponding to the conductive pattern and the criterion marks by exposing a dry film photoresist to light and developing it.

Then, the copper foil exposed from the etching resist was etched using aqueous ferric chloride, whereby the conductive pattern including the terminal portions and the criterion marks (of a square, 50 μm on a side) were formed simultaneously (Cf. FIG. 2(*b*)).

Then, after the etching resist was stripped, solder resist was coated over the insulating base layer including the conductive pattern, to form the opening corresponding to the terminal portions by photolithography. Thereafter, the solder resist was cured to thereby form the insulating cover layer of 10 μm thick (Cf. FIG. 2(*c*)).

Then, the presence or absence of an inhibitory portion was determined with reference to the criterion marks exposed from the opening of the insulating cover layer by examination under an optical microscope.

When the insulating cover layer was formed from the solder resist, the solder resist started to flow into between the lines of wire at the terminal portions due to the capillary phenomenon, going inwardly of the opening in the lengthwise direction of the lines of wire. When the flowing solder resist went beyond the criterion marks, a portion of the solder resist extending inwardly beyond the criterion marks was determined as the inhibitory portion.

When the inhibitory portion was present, the wired circuit board having such an inhibitory portion was dealt with as defective goods. On the other hand, when the inhibitory portion was absent, the wired circuit board having such an inhibitory portion was dealt with as confirming goods, so that an electronic component was mounted on the wired circuit board.

Example 2

Thousand wired circuit boards were produced in the following sequences.

An etching resist of 10 µm thick was formed on a copper clad laminate (two-layer base material) formed by laminating a copper foil of 18 µm thick on the insulating base layer of polyimide resin of 25 µm thick in the form of a pattern corresponding to the conductive pattern by exposing a dry film photoresist to light and developing it.

Then, the copper foil exposed from the etching resist was etched using aqueous ferric chloride, whereby the conductive pattern including the terminal portions was formed.

Then, after the etching resist was stripped, the criterion marks of circular through holes having a diameter of 50 µm were formed in the insulating base layer at the both widthwise outer sides further away from the both widthwise outermost sides of the lines of wire at the terminal portions by using ultraviolet laser.

Then, solder resist was coated over the insulating base layer including the conductive pattern, to form the opening corresponding to the terminal portions by photolithography. Thereafter, the solder resist was cured to thereby form the insulating cover layer of 10 µm thick.

Then, the presence or absence of an inhibitory portion was determined with reference to the criterion marks exposed from the opening of the insulating cover layer by examination under an optical microscope.

When the insulating cover layer was formed from the solder resist, the solder resist started to flow into between the lines of wire at the terminal portions due to the capillary phenomenon, going inwardly of the opening in the lengthwise direction of the lines of wire. When the flowing solder resist went beyond the criterion marks, a portion of the solder resist extending inwardly beyond the criterion marks was determined as the inhibitory portion.

When the inhibitory portion was present, the wired circuit board having such an inhibitory portion was dealt with as defective goods. On the other hand, when no inhibitory portion was present, the wired circuit board having such an inhibitory portion was dealt with as confirming goods, so that an electronic component was mounted on the wired circuit board.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A wired circuit board comprising:
    an insulating base layer;
    a conductive pattern formed on the insulating base layer, the conductive pattern including a plurality of lines of wire extending along a lengthwise direction of the wired circuit board;
    an insulating cover layer formed on the insulating base layer to cover the conductive pattern;
    terminal portions coupled to the conductive pattern, the terminal portions being provided to connect with external terminals of an external component;
    an opening formed in the insulating cover layer to expose the terminal portions and to provide a mounting area for the external component;
    an inhibitory region defined between an edge of the opening and a corresponding edge of the mounting area for the external component, the inhibitory region including the terminal portions therein and not including the insulating cover layer between the terminal portions;
    criterion marks provided on the insulating base layer between the edge of the opening and the corresponding edge of the mounting area of the external component to identify boundaries of the inhibitory region, the criterion marks being exposed from the opening and identifying the boundaries for enabling a determination of whether the insulating cover layer extends into the inhibitory region; and
    wherein the criterion marks are arranged between adjacent lines of wire.

2. The wired circuit board according to claim 1, wherein the criterion marks are positioned between selected terminal portions that extend from a same edge of the opening.

3. The wired circuit board according to claim 1, wherein the criterion marks include (i) a square shape, (ii) a triangular shape, (iii) a plus sign shape, (iv) a minus sign shape, (v) a T-shape, (vi) an L-shape, (vii) a circular shape or any combination of (i)-(vii).

4. The wired circuit board according to claim 1, wherein the criterion marks are spaced away from the mounting position of the external component.

* * * * *